(12) United States Patent
Kline

(10) Patent No.: US 6,483,330 B1
(45) Date of Patent: Nov. 19, 2002

(54) METHOD FOR SELECTING COMPONENTS FOR A MATCHED SET USING WAFER INTERPOSERS

(75) Inventor: Jerry D. Kline, Argyle, TX (US)

(73) Assignee: Eaglestone Partners I, LLC, Long Beach, CA (US)

( * ) Notice: Subject to any disclaimer, the term of this patent is extended or adjusted under 35 U.S.C. 154(b) by 105 days.

(21) Appl. No.: 09/659,152

(22) Filed: Sep. 11, 2000

(51) Int. Cl.$^7$ ............................................... G01R 31/02
(52) U.S. Cl. ..................... 324/754; 324/158.1; 324/757; 324/765; 438/17; 438/18
(58) Field of Search ............................. 324/754, 158.1, 324/765, 757, 760; 439/66, 67; 438/17, 18

(56) References Cited

U.S. PATENT DOCUMENTS

| | | |
|---|---|---|
| 4,628,411 A | 12/1986 | Balders et al. ............... 361/414 |
| 4,688,151 A | 8/1987 | Kraus et al. ................. 361/405 |
| 5,477,160 A * | 12/1995 | Love ........................... 324/755 |
| 5,517,515 A | 5/1996 | Spall et al. ................. 371/22.5 |
| 5,796,746 A | 8/1998 | Farnworth et al. .......... 371/21.1 |
| 5,838,060 A | 11/1998 | Comer ......................... 257/685 |
| 5,844,803 A | 12/1998 | Beffa ..................... 364/468.28 |
| 5,949,246 A | 9/1999 | Frankeny et al. ............ 324/765 |
| 6,002,178 A | 12/1999 | Lin .............................. 257/778 |
| 6,046,600 A | 4/2000 | Whetsel ....................... 324/763 |
| 6,050,829 A * | 4/2000 | Eldridge et al. ............. 324/754 |
| 6,246,247 B1 * | 6/2001 | Eldridge et al. ............. 324/754 |
| 6,275,051 B1 * | 8/2001 | Bachelder et al. .......... 324/754 |

* cited by examiner

Primary Examiner—Michael J. Sherry
Assistant Examiner—Jimmy Nguyen
(74) Attorney, Agent, or Firm—Lawrence R. Youst; Danamraj & Youst, P.C.

(57) ABSTRACT

A matched set of integrated circuit chips (74, 78) and a method for assembling such integrated circuit chips (74, 78) into a matched set are disclosed. A first semiconductor wafer (62) having a plurality of integrated circuit chips (74) of a first type and a second semiconductor wafer (64) having a plurality of integrated circuit chips (78) of a second type are electrically and mechanically coupled to a pair of interposers (52, 53) to form a pair of wafer-interposer assemblies (50, 51). The integrated circuit chips (74, 78) of the first and second wafers (62, 64) are then tested together. The wafer-interposer assemblies (52, 53) are then diced into a plurality of chip assemblies having chips (74) of the first type and a plurality of chip assemblies having chips (78) of the second type. Based upon the testing, at least one of the chip assemblies having chips (74) of the first type and at least one of the chip assemblies having chips (78) of the second type are selected for inclusion in the matched set.

42 Claims, 8 Drawing Sheets

METHOD FOR SELECTING COMPONENTS FOR A MATCHED SET USING WAFER INTERPOSERS

TECHNICAL FIELD OF THE INVENTION

The present invention relates in general to integrated circuits and, more particularly, to wafer level testing of multiple wafers for the selection of system components for a match set using wafer interposers to couple the wafers to a testing apparatus.

BACKGROUND OF THE INVENTION

Modern electronic devices utilize semiconductor chips, commonly referred to as integrated circuits, which incorporate numerous electronic elements. These chips are mounted on substrates which physically support the chips and electrically interconnect the chips with other elements of the circuit. Such substrates may then be secured to an external circuit board or chassis.

The size of the chips and substrate assembly is a major go concern in modern electronic product design. The size of each subassembly influences the size of the overall electronic device. Moreover, the size of each subassembly controls the required distance between each chip and between chips and other elements of the circuit. Delays in transmission of electrical signals between chips are directly related to these distances. These delays limit the speed of operation of the device. Thus, more compact interconnection assemblies, with smaller distances between chips and smaller signal transmission delays, can permit faster operations.

One approach for improving overall system performance is through the use of matched sets. For example, several identical or dissimilar components that have been identified by the individual testing phase of component processing to have certain performance tracking characteristics may be assembled together as a matched set. The components of such a matched sets are frequently attached to a single substrate in close proximity to one another. This strategy improves performance compared to conventional or non-optimized systems by reducing the overall space needed to accommodate the chips and by, among other things, shortening the distance between chips. Specifically, interconnect inductance and signal transmission delays are all reduced.

One type of matched set includes a collection of identical components which have been identified to meet specific system performance requirements. For example, radio frequency (RF) systems often employ identical filters, switches, power dividers, mixers and high frequency amplifiers. Typically, each of the identical components has been extensively tested individually prior to inclusion in this type of system. The individual characterization tests for a filter, for instance, might measure insertion loss and phase shift as a function of frequency, input power and temperature. These multi-dimensional arrays of data are then compared to each other to identify individual components that perform within acceptable limits relative to each other. Components that are found to exhibit similar behavior under the various input stimuli will constitute a matched set of identical devices. Conversely, components that are found to exhibit dissimilar behavior under the various input stimuli, for example, the gain of one component having a negative slope over temperature while the gain of another component having a positive slope over temperature, will constitute a mismatch of components that will not be placed in a chip collection.

Another type of matched set includes components of different device types that are combined such that the aggregate, cascaded performance meets system specifications. Mixed signal systems, for example, often utilize digital-to-analog (DAC) converters along with operational amplifiers (OpAmp) to process data. The performance of a product can often be improved by pairing a DAC with an OpAmp of similar performance. That is, the input characteristics of the OpAmp are optimized to match the output characteristics of the DAC. As in the case of the matched set of identical components described above, the component of a matched set of different components are also identified by comparing multi-dimensional arrays of data to each other to identify individual components that perform within acceptable limits relative to each other. Components that are found to exhibit similar behavior under the various input stimuli will form a matched set of different components while components that are found to exhibit dissimilar behavior under the various input stimuli are not placed in a chip collection due to the mismatch.

It has been found, however, that certain mismatches are not identified when the components are tested individually. In fact, certain mismatches are not identified until the entire chip collection is assembled and the components are tested together for the first time. As such, some chip collections must be disassembled so that the valuable components may be, for example, packaged as individual components, while other chip collections are simple discarded.

Therefore, a need has arisen for an improved method for selection of system components for a matched set. A need has also arisen for such a method that does not require elaborate data reduction of test results from individually tested components. Additionally, a need has arisen for such a method that allows for testing of the individual components together prior to the assembly of the matched set.

SUMMARY OF THE INVENTION

The present invention disclosed herein provides a chip collection, known as a matched set, that maximizes system performance by selecting well matched integrated circuit chips for assembly together into the matched set. The present invention achieves this result by allowing for testing of the various integrated circuit chips together prior to the assembly of the matched set. This testing is preformed by simultaneously connecting multiple wafer-interposer assemblies, each including a wafer level interposer and a wafer, to a testing apparatus. Thus, all of the chips to be included in the matched set may be tested together. After testing, these wafer-interposer assemblies are diced into a plurality of chip assemblies that are assembled into the matched set.

In its broadest form, the present invention provides for the attachment of two semiconductor wafers each having a plurality of integrated circuit chips thereon to a pair of interposers for testing of the integrated circuit chips. The integrated circuit chips of the first wafer may be of the same type as the integrated circuit chips of the second wafer, such as DRAM chips. Alternatively, the integrated circuit chips of the first wafer may be of a different type from the integrated circuit chips of the second wafer. For example, the integrated circuit chips of the first wafer may be amplifiers while the integrated circuit chips of the second wafer may be controllers. Likewise, the integrated circuit chips of the first wafer may carry the same type of signal as the integrated circuit chips of the second wafer, such as analog signals for an amplifier. Alternatively, the integrated circuit chips of the first wafer may carry a different type of signal than the integrated circuit chips of the second wafer. For example, the integrated circuit chips of the first wafer may be mixers that carry RF signals while the integrated circuit chips of the second wafer may be DSPs that carry digital signals.

Prior to testing, the two wafers are electrically and mechanically coupling to the two interposers such that the wafer-interposer assemblies may be connected to a testing apparatus. The testing may include performance tests over a range of temperatures, testing for leakage currents, testing for offset voltages and the like to determine which integrated circuit chips from the first wafer could be included in a matched set with particular integrated circuit chips from the second wafer to achieve optimum performance. Likewise, the testing may include grading of the integrated circuit chips of the first wafer and the second wafer for speed or other performance characteristics such that the integrated circuit chips of the first wafer that receive a particular grade are matched with integrated circuit chips from the second wafer having a similar grade. Additionally, the testing may include testing for non-conformance wherein certain integrated circuit chips of the first wafer may not be matched with any integrated circuit chips of the second wafer.

Once testing is complete, the wafer-interposer assemblies may be diced into a plurality of chip assemblies having chips of the first wafer and a plurality of chip assemblies having chips of the second wafer. One of the chip assemblies having a chip from the first wafer may them be matched with one of the chip assemblies having a chip from the second wafer, for inclusion in a matched set. This selection is based upon the results of the testing of the integrated circuit chips of the first wafer and the integrated circuit chips of the second wafer. Alternatively, more than one of the chip assemblies having chips from the first wafer may be matched with one or more chip assemblies having chips from the second wafer for inclusion in a matched set.

Using this process, all or substantially all of the integrated circuit chips from one wafer may be matched with one or more of the integrated circuit chips of a second wafer based upon the desired performance characteristics of the matched set that will contain these devices. By performing the testing prior to assembly of the matched set, the performance characteristics of each of the matched sets assembled using integrated circuit chips of the first and second wafers are enhanced as is the overall performance of the entire lot of matched set devices.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not define the scope of the invention.

Figure 1:
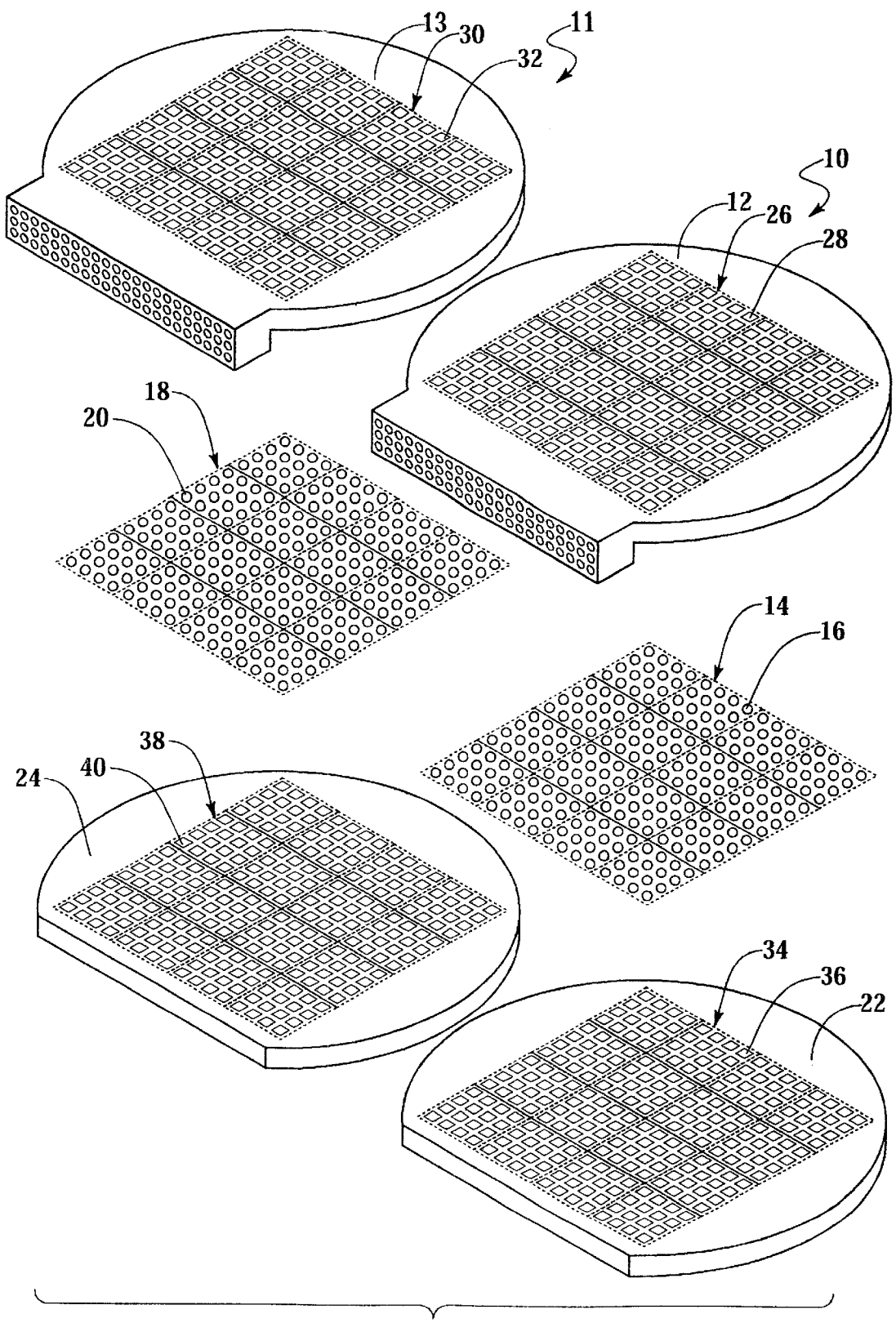
FIG. 1 is an exploded view of two wafer-interposer assemblies of the present invention including two wafers having chips of the same type.

The general features of a pair of wafer-interposer assemblies of the present invention are shown in FIG. 1 and are generally designated 10 and 11. Wafer-interposer assembly 10 includes a wafer interposer 12, an array 14 of conductive attachment elements 16 and a wafer 22. Wafer-interposer assembly 11 includes a wafer interposer 13, an array 18 of conductive attachment elements 20 and a wafer 24. Interposer 12 has an array 26 of conductive contact pads 28 on the upper surface thereof. Interposer 13 has an array 30 of conductive contact pads 32 on the upper surface thereof. Arrays 26 and 30 are each split into sixteen sections separated by dotted lines. The dotted lines represent the locations where interposers 12 and 13 will be cut when interposers 12 and 13 are diced into chip assemblies, including a section of interposer 12 and an associated chip from wafer 22 or a section of interposer 13 and an associated chip from wafer 24, as will be described in more detail below. It should be noted that while arrays 26 and 30 of interposers 12 and 13 are depicted as having sixteen sections in FIG. 1, this depiction is for simplicity and clarity of description as those skilled in the art will recognize that actual interposers will have several hundred or several thousand sections which correspond to the several hundred or several thousand chips on wafers 22 and 24.

Each of the sixteen sections of array 26 has sixteen contact pads 28 and each of the sixteen sections of array 30 has sixteen contact pads 32 depicted therein. The contact pads 28 and 32 represent the locations where interposers 12 and 13 will be electrically connected to a substrate once interposers 12 and 13 have been diced into chip assemblies, as will be described in more detail below. It should be noted that while array 26 is depicted as having sixteen contact pads 28 in each section and array 30 is depicted as having sixteen contact pads 32 in each section in FIG. 1, this depiction is for simplicity and clarity of description as those skilled in the art will recognize that the actual number of contact pads 28 and 32 in each section will be several hundred or several thousand contact pads.

On the lower surface of interposer 12 there is an array of conductive contact pads (not picture). In the illustrated embodiment, the contact pads on the lower surface of interposer 12 have the same geometry as contact pads 28. On the lower surface of interposer 13 there is an array of conductive contact pads (not picture). In the illustrated embodiment, the contact pads on the lower surface of interposer 13 have the same geometry as contact pads 32. The contact pads on the lower surface of interposer 12 represent the locations where interposer 12 will be electrically connected to wafers 22 while the contact pads on the lower surface of interposer 13 represent the locations where interposer 13 will be electrically connected to wafers 24, as will be described in more detail below. It should be noted that the actual number of sections and the actual number of contact pads in each section on the lower surface of interposers 12 and 13 will be several hundred or several thousand instead of sixteen. Also, it should be noted that directional terms, such as "above," "below," "upper," "lower," etc., are used for convenience in referring to the accompanying drawings as it is to be understood that the various embodiments of the present invention described herein may be utilized in various orientations, such as inclined, inverted, horizontal, vertical, etc., without departing from the principles of the present invention.

Array 14 of conductive attachment elements 16 is also split into sixteen sections separated by dotted lines. Each of the sections has sixteen conductive attachment elements 16 that correspond to the contact pads on the lower surface of interposer 12. Similarly, array 18 of conductive attachment elements 20 is split into sixteen sections separated by dotted lines. Each of the sections have sixteen conductive attachment elements 20 that correspond to the contact pads on the lower surface of interposer 13.

Conductive attachment elements 16 and 20 may be in the shape of balls, bumps, columns and the like. Conductive attachment elements 16 and 20 may be formed from any suitable electrically conductive material such as solder, including tin based solder, gold based solder, zinc based solder, indium based solder and the like. Alternatively, conductive attachment elements 16 and 20 may be formed from a conductive epoxy, a conductive polymer or the like. Conductive attachment elements 16 and 20 may be attached to interposers 12 and 13, respectively, by any number of attachment techniques including screening, flowing, molding, reflowing, dipping, electroplating, adhering and the like, depending upon which material is used for conductive attachment elements 16 and 20. In the illustrated embodiment, conductive attachment elements 16 and 20 are the same size, shape and material. As such, conductive attachment elements 16 and 20 may be attached to interposers 12 and 13 using the same process. It should be noted by those skilled in the art that conductive attachment elements 16 may be a different size, a different shape, a different material or may be attached to interposer 12 using a different process than conductive attachment elements 20 and interposer 13 without departing from the present invention. After assembly, conductive attachment elements 16 of array 14 electrically connect and mechanically bond contact pads 36 of each chip 34 to the facing contact pads on the lower surface of interposer 12. Likewise, conductive attachment elements 20 of array 18 electrically connect and mechanically bond contact pads 40 of each chip 38 to the facing contact pads on the lower surface of interposer 13. These permanent electrical and mechanical connections may be achieved using, for example, a heating method such as reflowing or thermal compression.

Wafer 22 has a plurality of chips 34 depicted thereon having dotted lines therebetween that represent the locations where wafer 22 will be cut when wafer 22 is diced into chip assemblies, as will be described in more detail below. Wafer 22 is depicted as having sixteen chips 34. This depiction is for simplicity and clarity of description as those skilled in the art will recognize that actual number of chips 34 on wafer 22 will be several hundred or several thousand.

Each chip 34 has a plurality of conductive contact pads 36 on its face. Each chip 34 is depicted as having sixteen contact pads 36, for simplicity and clarity of description, which correspond with one of the conductive attachment elements 16 in array 14 and represent the locations where chips 34 will be electrically connected to interposer 12. It should be noted by those skilled in the art that the actual number of contact pads 36 on each chip 34 will be several hundred or several thousand instead of sixteen.

Likewise, wafer 24 has a plurality of chips 38 depicted thereon having dotted lines therebetween that represent the locations where wafer 24 will be cut when wafer 24 is diced into chip assemblies, as will be described in more detail below. Wafer 24 is depicted as having sixteen chips 38. This depiction is for simplicity and clarity of description as those skilled in the art will recognize that actual number of chips 38 on wafer 24 will be several hundred or several thousand.

Each chip 38 has a plurality of conductive contact pads 40 on its face. Each chip 38 is depicted as having sixteen contact pads 40, for simplicity and clarity of description, which correspond with one of the conductive attachment elements 20 in array 18 and represent the locations where chips 38 will be electrically connected to interposer 13. It should be noted by those skilled in the art that the actual number of contact pads 40 on each chip 38 will be several hundred or several thousand instead of sixteen.

Together, wafer-interposer assemblies 10 and 11 allow for the simultaneous testing of chips 34 of wafer 22 and chips 38 of wafer 24. Simultaneous testing provides added efficiency to the testing process as numerous aspects of the functionality and performance of chips 34 and chips 38 may be tested. Importantly, this type of simultaneous testing allows for a determination of which chips 34 match up best with one another, which chips 38 match up best with one another and which chips 34 match up best with which chips 38. This allows for optimization of the overall performance of specific matched sets as well as the overall performance of the lot of matched sets made from chips 34 and 38. In this embodiment, the matched sets will comprise two or more chips of the same type that may come from either wafer 22 or wafer 24. For example, these matched sets may include multiple SRAM or DRAM components for use in a digital device, multiple amplifiers components for use in an analog device, multiple mixer, attenuator or circulator components for a RF device and the like.

Figure 2:
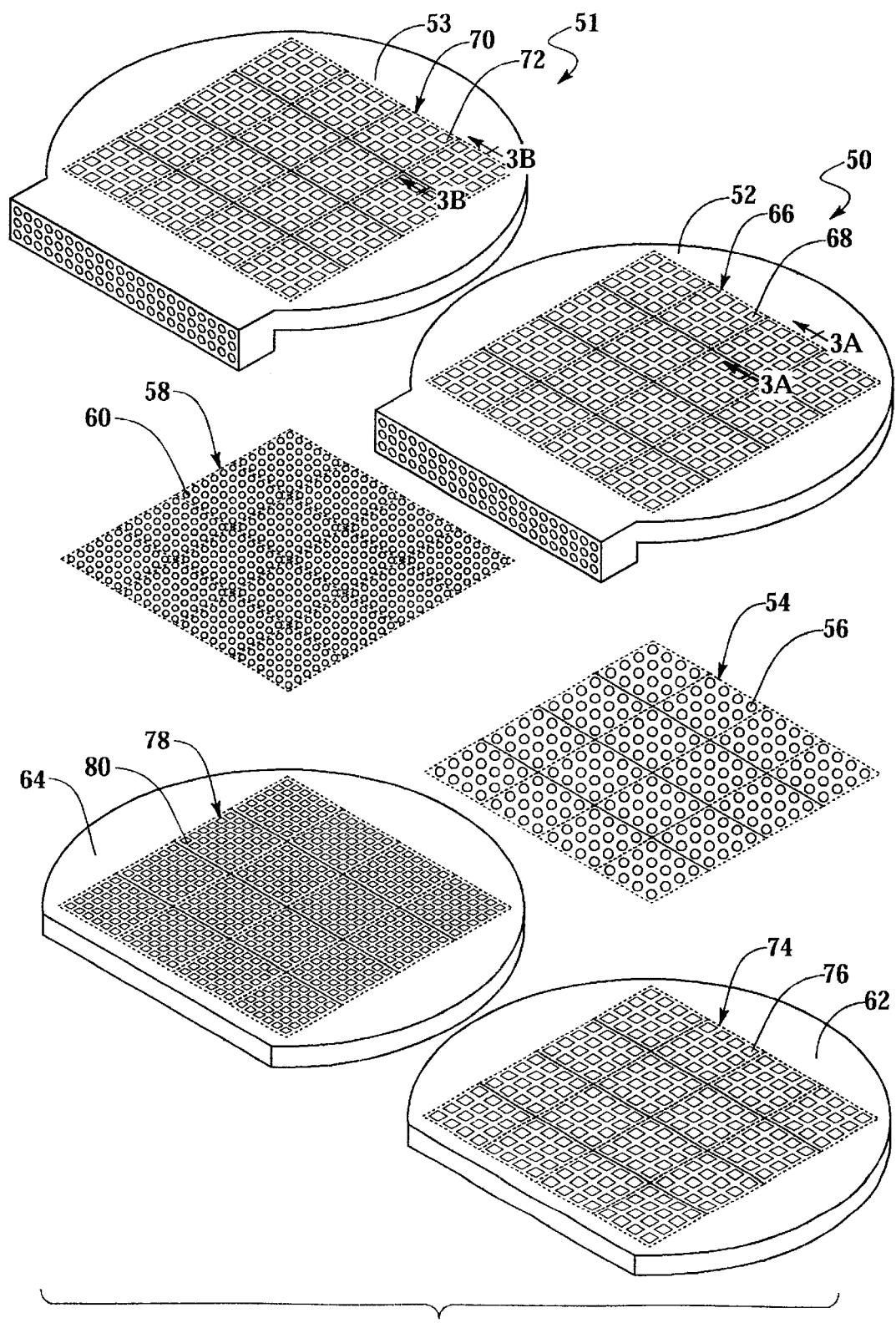
FIG. 2 is an exploded view of two wafer-interposer assemblies of the present invention including two wafers having chips of different types.

Referring now to FIG. 2, therein is depicted a pair of wafer-interposer assemblies 50 and 51 of the present invention. Wafer-interposer assembly 50 includes a wafer interposer 52, an array 54 of conductive attachment elements 56 and a wafer 62. Wafer-interposer assembly 51 includes a wafer interposer 53, an array 58 of conductive attachment elements 60 and a wafer 64. Interposer 52 has an array 66 of conductive contact pads 68 on the upper surface thereof. Interposer 53 has an array 70 of conductive contact pads 72 on the upper surface thereof. Arrays 66 and 70 are each split into sixteen sections separated by dotted lines which represent the locations where interposer 52 and 53 will be diced.

Each of the sixteen sections of array 66 has sixteen contact pads 68 and each of the sixteen sections of array 70 has sixteen contact pads 72 depicted therein. The contact pads 68 and 72 represent the locations where interposers 52 and 53 will be electrically connected to a substrate once interposers 52 and 53 have been diced.

On the lower surface of interposer 52 there is an array of conductive contact pads (not picture). In the illustrated embodiment, the contact pads on the lower surface of interposer 52 have the same geometry as contact pads 68. On the lower surface of interposer 53 there is an array of conductive contact pads (not picture). In the illustrated embodiment, the contact pads on the lower surface of interposer 53 do not have the same geometry as contact pads 72, as will be explained in greater detail below.

Array 54 of conductive attachment elements 56 is split into sixteen sections separated by dotted lines. Each of the sections has sixteen conductive attachment elements 56 that correspond to the contact pads on the lower surface of interposer 52. Array 58 of conductive attachment elements 60 is split into sixteen sections separated by dotted lines. Each of the sections have thirty-six conductive attachment elements 60 that correspond to the contact pads on the lower surface of interposer 53. In the illustrated embodiment, conductive attachment elements 56 are depicted as being larger than conductive attachment elements 60 and having a larger pitch. Conductive attachment elements 56 and 60 are of the same shape and preferably are of the same material such that conductive attachment elements 56 and 60 may be attached to interposers 52 and 53, respectively, using the same process, however, this is not a requirement of the present invention.

Wafer 62 is attached to the lower surface of interposer 52. Wafer 62 has a plurality of chips 74 depicted thereon having dotted lines therebetween that represent the locations where wafer 62 will be diced. Each chip 74 has a plurality of conductive contact pads 76 on its face. Each chip 74 is depicted as having sixteen contact pads 76, which correspond with one of the conductive attachment elements 56 in array 54 and represent the locations where chips 74 will be electrically connected to interposer 52.

Likewise, wafer 64 is attached to the lower surface of interposer 53 and has a plurality of chips 78 depicted thereon having dotted lines therebetween that represent the locations where wafer 64 will be diced. Wafer 64 is depicted as having sixteen chips 78. Each chip 78 has a plurality of conductive contact pads 80 on its face. Each chip 78 is depicted as having thirty-six contact pads 80, which correspond with the conductive attachment elements 60 in array 58 and represent the locations where chips 78 will be electrically connected to interposer 53.

In the illustrated embodiment, chips 74 of wafer 62 are of a different type than chips 78 of wafer 64. Together, wafer-interposer assemblies 50 and 51 allows for the simultaneous testing of different types of chips 74 and 78 from the two wafers 62 and 64 which provides significant efficiency gains over prior art testing scenarios. Specifically, the functionality and performance of one or more chips 74 and one or more chips 78 may be tested simultaneously to determine whether specific chips 74 match well with specific chips 78 so that matched sets containing chips 74 and 78 may be assembled. For example, these matched sets may include a controller and multiple amplifiers, a RF mixer and a DSP, an ASIC component and multiple SRAMs as well as enumerable other desirable component combinations.

Figure 3A:
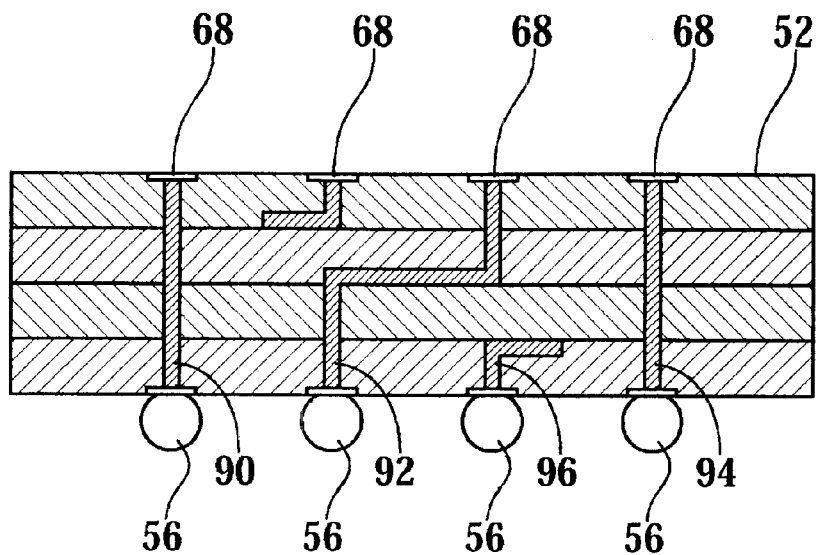
FIGS. 3A–3B are cross sectional views taken respectively along line 3A—3A and 3B—3B of FIG. 2.

Referring next to FIG. 3A, a cross sectional view of interposer 52 taken along line 3A—3A is depicted. Interposer 52 includes a plurality of layers having routing lines and vias therein which serve as electrical conductors. One set of conductors, depicted as conductors 90, 92 and 94, pass through interposer 52 and serve to electrically connect pads 76 of chips 74 to the contact pads 68 of interposer 52. Conductors 90, 92 and 94 are selected to have suitable conductivity and may be, for example, copper. Interposer 52 also includes a set of testing conductors, depicted as conductor 96, that pass through interposer 52 connecting some of the contact pads 76 of chips 74 to a testing apparatus as will be explained in greater detail below. The testing conductors may provide direct electrical connection to the testing apparatus or may pass through a multiplexer or other intervening apparatus (not shown) incorporated into interposer 52.

Referring both to FIGS. 2 and 3A, it can be seen that contact pads 76 of chips 74 and contact pads 68 of interposer 52 have identical geometries. The present invention, however, is by no means limited to having identical geometries. As each die design may have unique pad geometry, one of the advantages of the present invention is that the contact pads on the upper surface of an interposer may utilize a geometry that is different from that of the contact pads of the chips. Traditionally, chip designers have been limited in chip layout in that all connections between the elements of a chip and the outside world had to be made either through the peripheral edges of the chip (for wire bonding) or at least through a standard pin or pad layout defined by a standardization body, such as the Joint Electrical Dimensional Electronic Committee (JEDEC). The interconnection requirements, therefore, have traditionally driven the chip layout. Chip designs for use with an interposer of the present invention are not limited by such constraints.

Figure 3B:
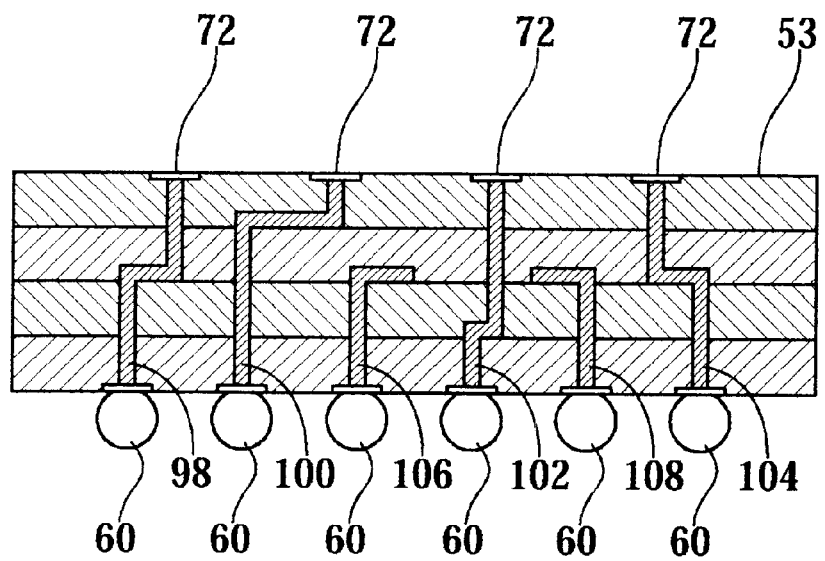

For example, as best seen in FIG. 3B, interposer 53 includes a plurality of layers having routing lines and vias therein which serve as electrical conductors. One set of conductors, depicted as conductors 98, 100, 102 and 104 pass through interposer 53 to electrically connect contact pads 72 on the upper surface of interposer 53 to contact pads 80 on chips 78 (see FIG. 2). Another set of conductors, depicted as conductors 106 and 108, are testing conductors that pass through interposer 53 and are used to connect certain pads 80 of chips 78 to a testing apparatus, as will be explained in greater detail below. As such, the geometry of pads 72 on the upper surface of interposer 53 is different from that of pads 80 on chips 78.

Figure 4:
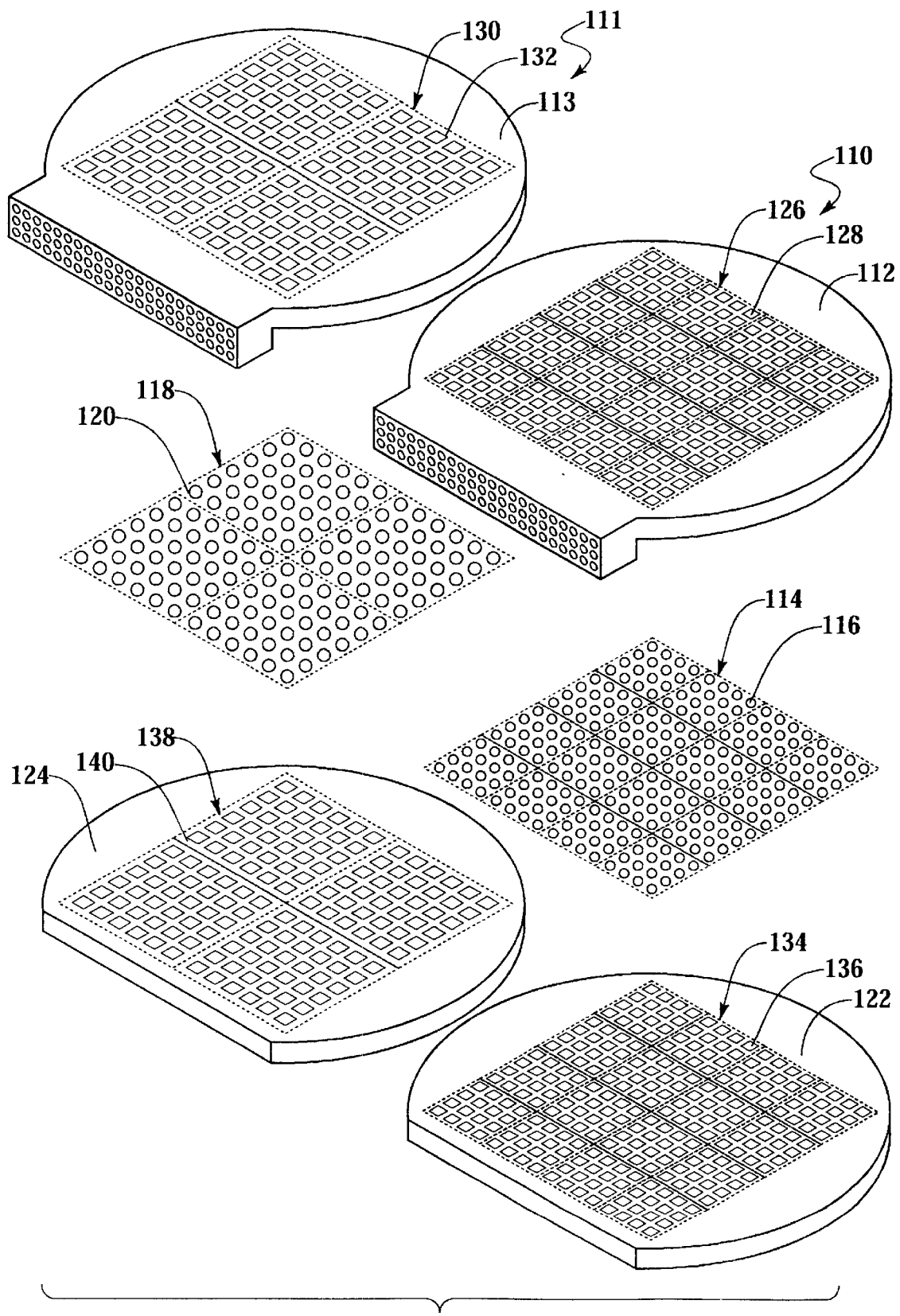
FIG. 4 is an exploded view of two wafer-interposer assemblies of the present invention including two wafers having chips of different types.

Referring now to FIG. 4, therein is depicted a pair of wafer-interposer assemblies 110 and 111 of the present invention. Wafer-interposer assembly 110 includes a wafer interposer 112, an array 114 of conductive attachment elements 116 and a wafer 122. Wafer-interposer assembly 111 includes a wafer interposer 114, an array 118 of conductive attachment elements 120 and a wafer 124. Interposer 112 has an array 126 of conductive contact pads 128 on the upper surface thereof. Interposer 113 has an array 130 of conductive contact pads 132 on the upper surface thereof. Array 126 is each split into sixteen sections separated by dotted lines which represent the locations where interposer 112 will be diced. Likewise, array 130 is each split into four sections separated by dotted lines which represent the locations where interposer 113 will be diced.

Each of the sixteen sections of array 126 has sixteen contact pads 128 which represent the locations where interposer 112 will be electrically connected to a substrate once interposer 112 has been diced. Each of the four sections of array 130 has thirty-six contact pads 132 which represent the locations where interposer 113 will be electrically connected to a substrate once interposer 113 has been diced.

On the lower surface of interposer 112 there is an array of conductive contact pads (not picture). In the illustrated embodiment, the contact pads on the lower surface of interposer 112 have the same geometry as contact pads 128. On the lower surface of interposer 113 there is an array of conductive contact pads (not picture). In the illustrated embodiment, the contact pads on the lower surface of interposer 113 have the same geometry as contact pads 132.

Array 114 of conductive attachment elements 116 is split into sixteen sections separated by dotted lines. Each of the sections has sixteen conductive attachment elements 116 that correspond to the contact pads on the lower surface of interposer 112. Array 118 of conductive attachment elements 120 is split into four sections separated by dotted lines. Each of the sections have thirty-six conductive attachment elements 120 that correspond to the contact pads on the lower surface of interposer 113. In the illustrated embodiment, conductive attachment elements 120 are depicted as being larger than conductive attachment elements 116 and having a larger pitch. Conductive attachment elements 116 and 120 are of the same shape and preferably are of the same material such that conductive attachment elements 116 and 120 may be attached to interposers 112 and 113, respectively, using the same process, however, this is not a requirement of the present invention.

Wafer 122 is attached to the lower surface of interposer 112. Wafer 122 has a plurality of chips 134 depicted thereon having dotted lines therebetween that represent the locations where wafer 122 will be diced. Each chip 134 has a plurality of conductive contact pads 136 on its face. Each chip 134 is depicted as having sixteen contact pads 136, which correspond with one of the conductive attachment elements 116 in array 114 and represent the locations where chips 134 will be electrically connected to interposer 112.

Likewise, wafer 124 is attached to the lower surface of interposer 113 and has a plurality of chips 138 depicted thereon having dotted lines therebetween that represent the locations where wafer 134 will be diced. Wafer 134 is depicted as having four chips 138. Each chip 138 has a plurality of conductive contact pads 140 on its face. Each chip 138 is depicted as having thirty-six contact pads 140, which correspond with the conductive attachment elements 120 in array 118 and represent the locations where chips 138 will be electrically connected to interposer 113.

In the illustrated embodiment, chips 134 of wafer 122 are of a different type than chips 138 of wafer 124. Together, wafer-interposer assemblies 110 and 111 allow for the simultaneous testing of different types of chips 134 and 138 from the two wafers 122 and 124 which provides significant efficiency gains over prior art testing scenarios. Specifically, the functionality and performance of one or more chips 134 and one or more chips 138 may be tested simultaneously to determined whether specific chips 134 match well with specific chips 138.

As with the embodiments depicted in FIGS. 1 and 2, it should be understood by those skilled in the art that even though two wafer-interposer assemblies have been depicted in FIG. 4 that allow for simultaneous testing of the chips on two wafers, any number of wafer-interposer assemblies could alternatively be used to simultaneously test the chips of a greater number of wafers that have the same or different types of chips thereon without departing from the principles of the present invention.

Figure 5:
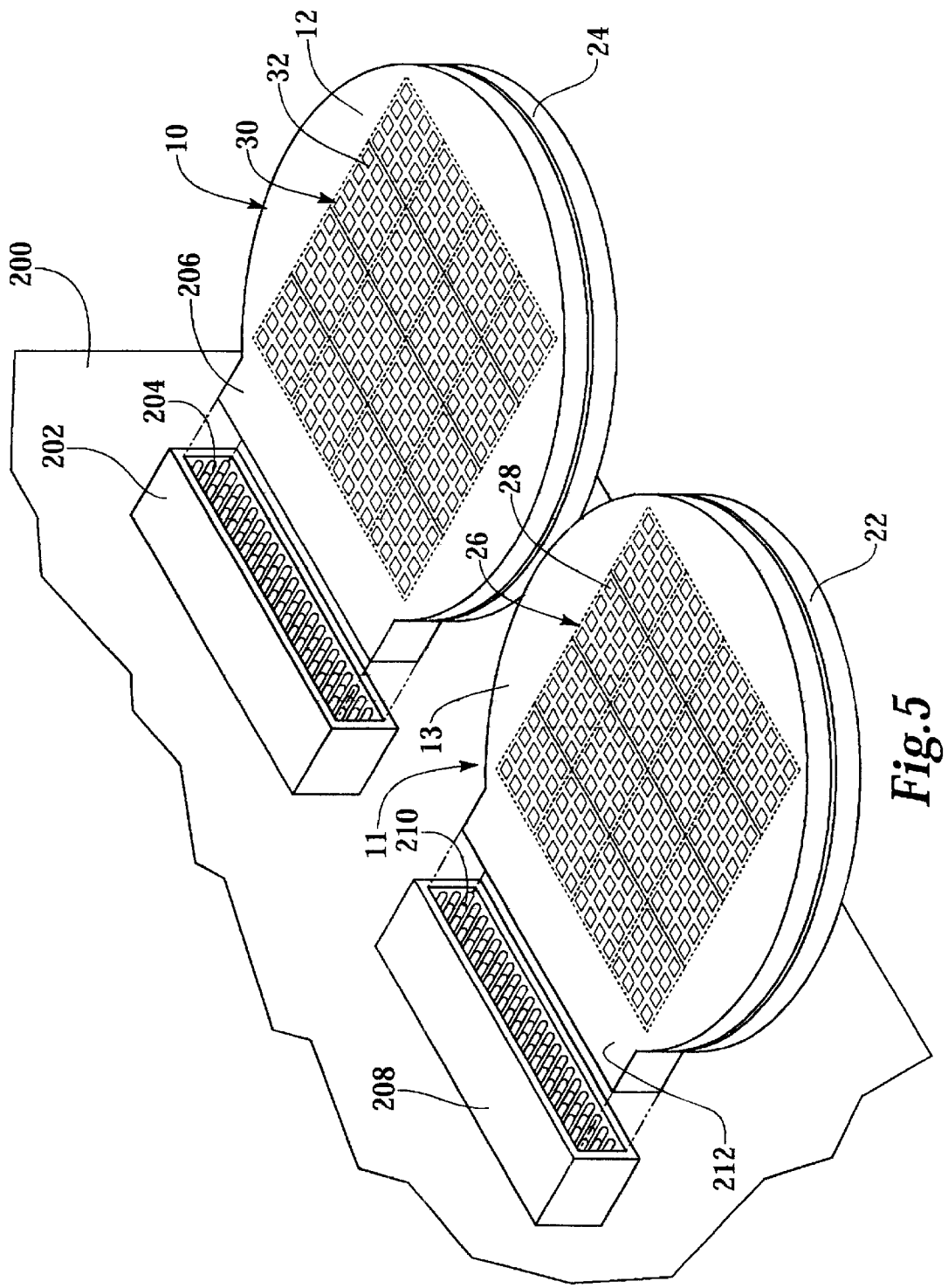
FIG. 5 is a partially exploded view of two wafer-interposer assemblies of the present invention inserted into a testing apparatus.

Referring now to FIG. 5, therein is depicted wafer-interposer assemblies 10 and 11 of FIG. 1 connected to a testing unit 200. Wafer-interposer assembly 10 interfaces with testing unit 200 through a testing connector 202 that comprises a plurality of testing contacts 204, shown here as pins. The testing contacts 204 of testing connector 202 connect with the testing sockets of testing connector 206 of wafer-interposer assembly 10. Likewise, wafer-interposer assembly 11 interfaces with testing unit 200 through a testing connector 208 that comprises a plurality of testing contacts 210, shown here as pins. The testing contacts 210 of testing connector 208 connect with the testing sockets of testing connector 212 of wafer-interposer assembly 11

After electrical connection to the testing unit 200, wafer-interposer assemblies 10 and 11 can be used to run chips 34 and 38 (see FIG. 1) on wafers 22 and 24 through any number of tests including a complete parametric test, a burn-in or whatever subsets thereof are deemed necessary for that particular chip design. During the course of testing, signals may be sent to chips 34 and 38 to test each function of the chips which may ideally occur across a range of conditions, so as to simulate real world operation. Testing unit 200 may incorporate a heating and cooling apparatus for testing the chips across a range of temperatures. Testing unit 200 may also incorporate a device for vibrating or otherwise mechanically stressing chips 34 and 38.

More specifically, wafer-interposer assemblies 10 and 11 of the present invention may be used to select chips 34 and 38 from each of the wafers 22 and 24 that will be used in a matched set of chips. For example, the testing may include performance tests over a range of temperatures, testing for leakage currents, testing for offset voltages and the like to determine which chips 34 from wafer 22 could be included in a matched set with which chips 38 from wafer 24 to achieve optimum performance. Alternatively, the testing may result in giving chips 34 and 38 of wafers 22 and 24 a grade for speed or other performance characteristics such that chips 34 of a particular grade may be matched with chips 38 of that same grade. Additionally, the testing may result in a non-conformance or mismatch determination wherein certain chips 34 may not be matched with certain chips 38. Certain chips 34 may alternatively be designated as incompatible with any chips 38.

While FIG. 5 has been described as attaching wafer-interposer assemblies 10 and 11 of FIG. 1 to testing unit 200 wherein chips 34 and 38 are of the same type, it should be understood by those skilled in the art that a similar testing procedures will be followed when the chips of the two wafers are of different types, such as using wafer-interposer assemblies 50 and 51 of FIG. 2 or wafer-interposer assemblies 110 and 111 of FIG. 4. Likewise, it should be understood by those skilled in the art that a similar testing procedures will also be followed when more than two wafer-interposer assemblies are attached to a testing unit to test the chips on more that two wafers simultaneously.

Figure 6:
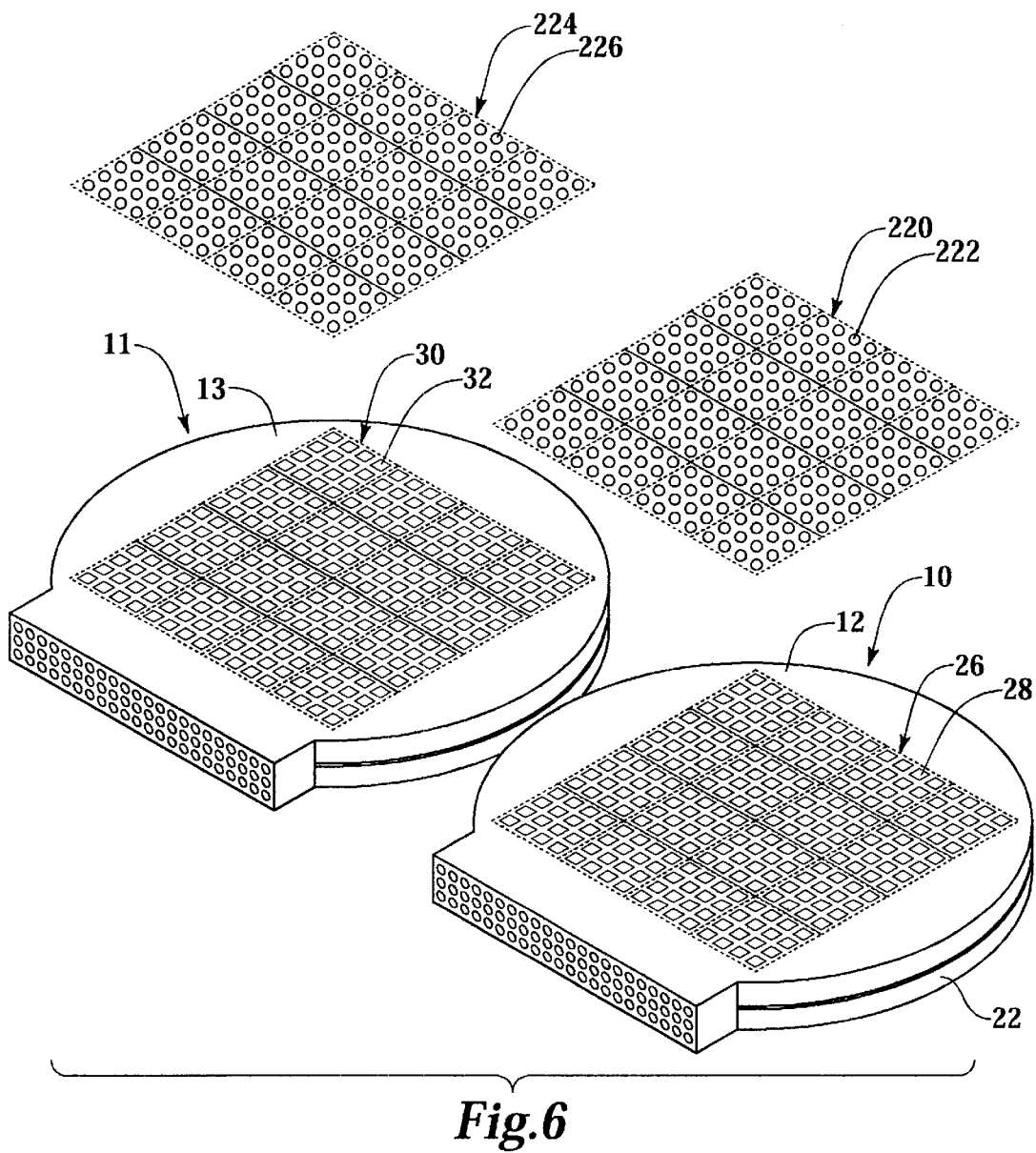
FIG. 6 is an exploded view of two wafer-interposer assemblies of the present invention.

Referring next to FIG. 6, wafer-interposer assembly 10 of FIG. 1 is depicted including an array 220 of conductive attachment elements 222. Similarly, wafer-interposer assembly 11 of FIG. 1 is depicted including an array 224 of conductive attachment elements 226. Array 220 is split into sixteen sections separated by dotted lines. Each of the sections has sixteen conductive attachment elements 222 that correspond to contact pads 28 of array 26 on interposer 12. Similarly, array 224 of conductive attachment elements 226 is split into sixteen sections separated by dotted lines. Each of the sections have sixteen conductive attachment elements 226 that correspond to contact pads 32 of array 34 on interposer 13.

In the illustrated embodiment, conductive attachment elements 222 and 226 are the same size, shape and material. As such, conductive attachment elements 222 and 226 may be attached to interposers 12 and 13 using the same process. It should be noted by those skilled in the art that conductive attachment elements 222 may be a different size, a different shape, a different material or may be attached to interposer 12 using a different process than conductive attachment elements 226 and interposer 13 without departing from the present invention.

After assembly, conductive attachment elements 222 will be used to electrically connect and mechanically bond a diced section of wafer-interposer assembly 10, including a section of interposer 12 and its associated chip 34 to a substrate, as will be explained in more detail below. Likewise, conductive attachment elements 226 will be used to electrically connect and mechanically bond a diced section of wafer-interposer assembly 11, including a section of interposer 13 and its associated chip 38 to a substrate. These permanent electrical and mechanical connections may be achieved using, for example, a heating method such as reflowing or thermal compression.

Figure 7:
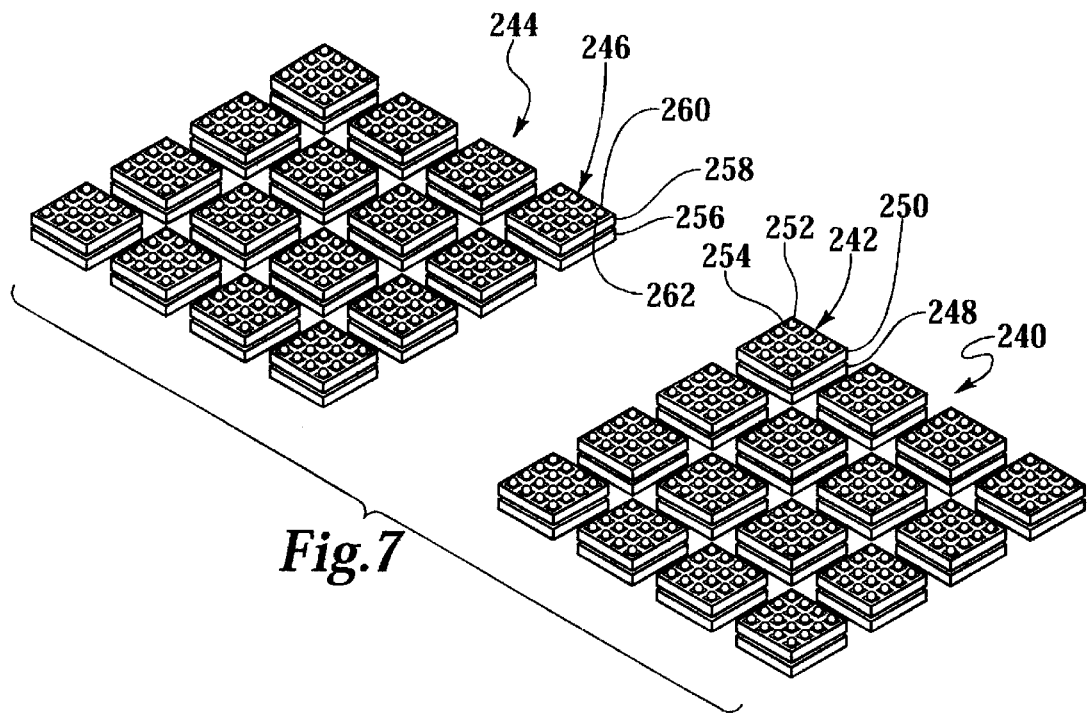
FIG. 7 is an isometric view of a plurality of chip assemblies after singulation of two wafer-interposer assemblies of the present invention.

FIG. 7 shows an array 240 of chip assemblies 242 and an array 244 of chip assemblies 246 after singulation of a pair of wafer-interposer assembly of the present invention. Each chip assembly 242 comprises a chip 248 from a wafer, a section 250 of an interposer and a plurality of conductive attachment elements 252 disposed on conductive contact pads 254 on the exposed surface of chip assemblies 242. Likewise, each chip assembly 246 comprises a chip 256 from another wafer, a section 258 of another interposer and a plurality of conductive attachment elements 260 disposed on conductive contact pads 262 on the exposed surface of chip assemblies 246. Chip assemblies 242 and 246 may, for example, include chips of the same type, such as those diced from wafer-interposer assemblies 10 and 11 of FIG. 1, or may contain chips of different types such as those diced from wafer-interposer assemblies 50 and 51 of FIG. 2.

Figure 8:
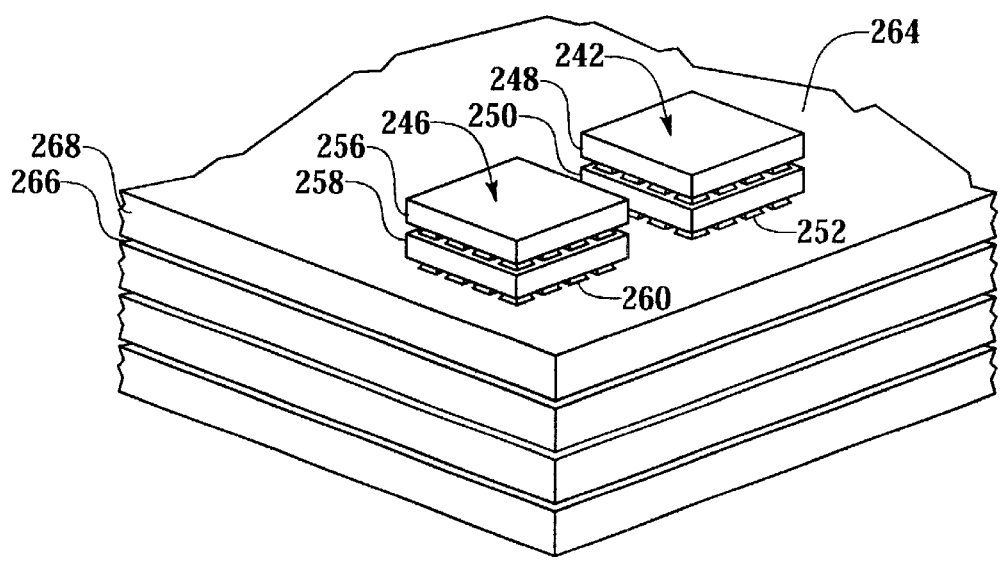
FIG. 8 is an isometric view of a matched set of chip assemblies of the present invention having chips from different wafers in place on a substrate.

As best seen in FIG. 8, a chip assembly 242 and a chip assembly 246 may be mounted together on a substrate 264 as a matched set. Substrate 264 has a plurality of conductive layers 266 and dielectric layers 268. Chip assemblies 242 and 246 are electrically and mechanically attached to contact pads on the surface of substrate 264 through conductive attachment elements 252 and 260, respectively. Assembled as shown, the diced sections 250 and 258 of the two interposers provide electrical connection between chips 248 and 256 and substrate 264. In certain embodiments, substrate 264 may be a traditional FR4 circuit board. Alternatively, substrate 264 may be composed of a higher grade material such as a ceramic, which is typically used in multichip packages.

Figure 9:
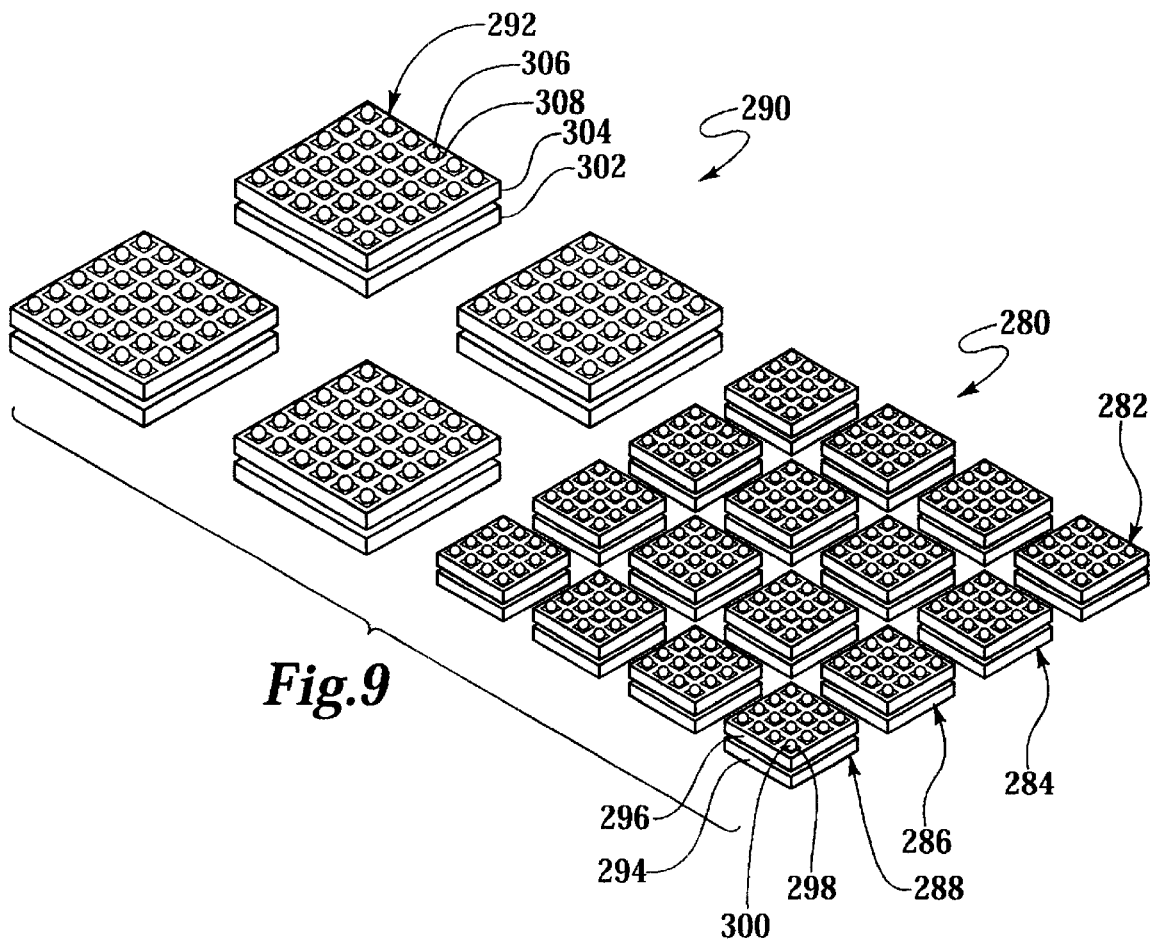
FIG. 9 is an isometric view of a plurality of chip assemblies after singulation of two wafer-interposer assemblies of the present invention.

Turning now to FIG. 9, therein is depicted an array 280 of chip assemblies, including chip assemblies 282, 284, 286 and 288, after dicing a wafer-interposer assembly of the present invention and an array 290 of chip assemblies 292 after dicing another wafer-interposer assembly of the present invention. Each chip assembly 282, 284, 286 and 288 includes a chip from a wafer, a section of an interposer and a plurality of conductive attachment elements disposed on conductive pads on the exposed surfaces thereof. As illustrated, chip assembly 288 includes a chip 294, a section 296 of the interposer and a plurality of conductive attachment elements 298 disposed on conductive pads 300. Chip assembly 292 includes a chip 302 from another wafer, a section 304 of another interposer and a plurality of conductive attachment elements 306 disposed on conductive pads 308. In the illustrated embodiment, chip assemblies 282, 284, 286 and 288 contain chips of different type than chip assembly 292 such as those diced from wafer-interposer assemblies 110 and 111 of FIG. 4. For example, chip assemblies 282, 284, 286 and 288 may be amplifiers while chip assembly 292 may be a controller.

Figure 10:
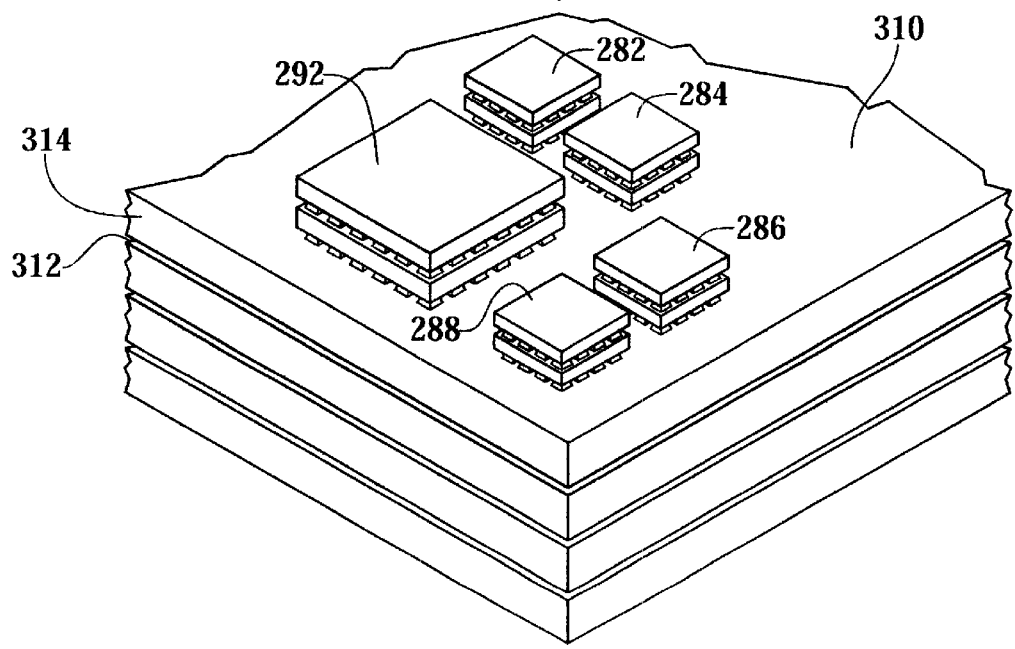
FIG. 10 is an isometric view of a matched set of chip assemblies of the present invention including chips of different types in place on a substrate.

As best seen in FIG. 10, a matched set of components may be mounted on a substrate 310 that has a plurality of conductive layers 312 and dielectric layers 314. Specifically, chip assemblies 282, 284, 286 and 288 may be mounted together on a substrate 310 with chip assembly 292. Chip assemblies 282, 284, 286 and 288 are electrically and mechanically attached to contact pads on the surface of substrate 310 through conductive attachment elements 298. Likewise, chip assembly 292 is electrically and mechanically attached to contact pads on the surface of substrate 310 through conductive attachment elements 306. Assembled as shown, the diced sections 296 and 304 of the two interposers provide electrical connection between substrate 310 and chips 294 of chip assemblies 282, 284, 286 and 288 and chip 302 of chip assembly 292.

While FIGS. 8 and 10 have depicted the matched sets of component as including two chip assemblies and five chip assemblies, respectively, it should be understood by those skilled in the art that any number of chip assemblies may be utilized in such a matched set. The specific number of chip assemblies will be selected based upon the desired functionality of the matched set. Also, while FIGS. 7 and 9 have depicted the components for the matched sets as coming from two wafers, it should be understood by those skilled in the art that the components may come from any number of wafers that have been tested together. The testing process of the present invention provides for each of the components of a matched set, regardless of the number, to be tested together as part of a single testing procedure. As such, the components for the matched sets are selected to be assembled together only after successful testing.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for selecting components for a matched set comprising the steps of:

electrically and mechanically coupling a first semiconductor wafer having a plurality of integrated circuit chips of a first type to a first interposer to form a first wafer-interposer assembly;

electrically and mechanically coupling a second semiconductor wafer having a plurality of integrated circuit chips of a second type to a second interposer to form a second wafer-interposer assembly;

testing the integrated circuit chips of the first type and the integrated circuit chips of the second type together;

dicing the first wafer-interposer assembly into a plurality of chip assemblies having chips of the first type;

dicing the second wafer-interposer assembly into a plurality of chip assemblies having chips of the second type; and selecting at least one of the chip assemblies having chips of the first type and at least one of the chip assemblies having chips of the second type for inclusion in the matched set based upon the testing.

2. The method as recited in claim 1 wherein the step of testing the integrated circuit chips of the first type and the integrated circuit chips of the second type further comprises testing the integrated circuit chips of the first type and the integrated circuit chips of the second type for performance over a range of temperatures.

3. The method as recited in claim 1 wherein the step of testing the integrated circuit chips of the first type and the integrated circuit chips of the second type further comprises testing the integrated circuit chips of the first type and the integrated circuit chips of the second type for leakage currents.

4. The method as recited in claim 1 wherein the step of testing the integrated circuit chips of the first type and the integrated circuit chips of the second type further comprises testing the integrated circuit chips of the first type and the integrated circuit chips of the second type for offset voltages.

5. The method as recited in claim 1 wherein the step of testing the integrated circuit chips of the first type and the integrated circuit chips of the second type further comprises testing the integrated circuit chips of the first type and the integrated circuit chips of the second type for speed grades.

6. The method as recited in claim 1 wherein the step of testing the integrated circuit chips of the first type and the integrated circuit chips of the second type further comprises testing the integrated circuit chips of the first type and the integrated circuit chips of the second type for performance grades.

7. The method as recited in claim 1 wherein the step of testing the integrated circuit chips of the first type and the integrated circuit chips of the second type further comprises testing the integrated circuit chips of the first type and the integrated circuit chips of the second type for non-conformance.

8. The method as recited in claim 1 wherein the integrated circuit chips of the first type and the integrated circuit chips of the second type are digital devices.

9. The method as recited in claim 1 wherein the integrated circuit chips of the first type and the integrated circuit chips of the second type are analog devices.

10. The method as recited in claim 1 wherein the integrated circuit chips of the first type and the integrated circuit chips of the second type are RF devices.

11. The method as recited in claim 1 further comprising selecting at least two of the chip assemblies having chips of the first type and at least one of the chip assemblies having chips of the second type for inclusion in the matched set.

12. A method for selecting components for a matched set comprising the steps of:
 providing first and second semiconductor wafers each having a plurality of integrated circuit chips;
 electrically and mechanically coupling the first wafer to a first interposer to form a first wafer-interposer assembly;
 electrically and mechanically coupling the second wafer to a second interposer to form a second wafer-interposer assembly;
 testing the integrated circuit chips of the first and second wafers together;
 dicing the first wafer-interposer assembly into a plurality of chip assemblies having chips of the first wafer;
 dicing the second wafer-interposer assembly into a plurality of chip assemblies having chips of the second wafer; and
 selecting at least one of the chip assemblies having chips of the first wafer and at least one of the chip assemblies having chips of the second wafer for inclusion in the matched set based upon the testing.

13. The method as recited in claim 12 wherein the integrated circuit chips of the first wafer are integrated circuits of a first type and the integrated circuit chips of the second wafer are integrated circuits of a second type.

14. The method as recited in claim 12 wherein the step of testing the integrated circuit chips of the first wafer and the integrated circuit chips of the second wafer further comprises testing the integrated circuit chips of the first wafer and the integrated circuit chips of the second wafer for performance over a range of temperatures.

15. The method as recited in claim 12 wherein the step of testing the integrated circuit chips of the first wafer and the integrated circuit chips of the second wafer further comprises testing the integrated circuit chips of the first wafer and the integrated circuit chips of the second wafer for leakage currents.

16. The method as recited in claim 12 wherein the step of testing the integrated circuit chips of the first wafer and the integrated circuit chips of the second wafer further comprises testing the integrated circuit chips of the first wafer and the integrated circuit chips of the second wafer for offset voltages.

17. The method as recited in claim 12 wherein the step of testing the integrated circuit chips of the first wafer and the integrated circuit chips of the second wafer further comprises testing the integrated circuit chips of the first wafer and the integrated circuit chips of the second wafer for speed grades.

18. The method as recited in claim 12 wherein the step of testing the integrated circuit chips of the first wafer and the integrated circuit chips of the second wafer further comprises testing the integrated circuit chips of the first wafer and the integrated circuit chips of the second wafer for performance grades.

19. The method as recited in claim 12 wherein the step of testing the integrated circuit chips of the first wafer and the integrated circuit chips of the second wafer further comprises testing the integrated circuit chips of the first wafer and the integrated circuit chips of the second wafer for non-conformance.

20. The method as recited in claim 12 wherein the integrated circuit chips of the first wafer and the integrated circuit chips of the second wafer are digital devices.

21. The method as recited in claim 12 wherein the integrated circuit chips of the first wafer and the integrated circuit chips of the second wafer are analog devices.

22. The method as recited in claim 12 wherein the integrated circuit chips of the first wafer and the integrated circuit chips of the second wafer are RF devices.

23. The method as recited in claim 12 further comprising selecting at least two of the chip assemblies having chips of the first wafer and at least one of the chip assemblies having chips of the second wafer for inclusion in the matched set.

24. A method for assembling a matched set comprising the steps of:
 providing first and second semiconductor wafers each having a plurality of integrated circuit chips;
 electrically and mechanically coupling the first wafer to a first interposer to form a first wafer-interposer assembly;
 electrically and mechanically coupling the second wafer to a second interposer to form a second wafer-interposer assembly;
 testing the integrated circuit chips of the first and second wafers together;
 dicing the first wafer-interposer assembly into a plurality of chip assemblies having chips of the first wafer;

dicing the second wafer-interposer assembly into a plurality of chip assemblies having chips of the second wafer;

sorting the chip assemblies having chips of the first wafer and the chip assemblies having chips of the second wafer based upon the testing; and electrically coupling at least one of the chip assemblies having chips of the first wafer and at least one of the chip assemblies having chips of the second wafer onto a substrate, thereby assembling the matched set.

25. The method as recited in claim 24 wherein the integrated circuit chips of the first wafer are integrated circuits of a first type and the integrated circuit chips of the second wafer are integrated circuits of a second type.

26. The method as recited in claim 24 wherein the step of testing the integrated circuit chips of the first wafer and the integrated circuit chips of the second wafer further comprises testing the integrated circuit chips of the first wafer and the integrated circuit chips of the second wafer for performance over a range of temperatures.

27. The method as recited in claim 24 wherein the step of testing the integrated circuit chips of the first wafer and the integrated circuit chips of the second wafer further comprises testing the integrated circuit chips of the first wafer and the integrated circuit chips of the second wafer for leakage currents.

28. The method as recited in claim 24 wherein the step of testing the integrated circuit chips of the first wafer and the integrated circuit chips of the second wafer further comprises testing the integrated circuit chips of the first wafer and the integrated circuit chips of the second wafer for offset voltages.

29. The method as recited in claim 24 wherein the step of testing the integrated circuit chips of the first wafer and the integrated circuit chips of the second wafer further comprises testing the integrated circuit chips of the first wafer and the integrated circuit chips of the second wafer for speed grades.

30. The method as recited in claim 24 wherein the step of testing the integrated circuit chips of the first wafer and the integrated circuit chips of the second wafer further comprises testing the integrated circuit chips of the first wafer and the integrated circuit chips of the second wafer for performance grades.

31. The method as recited in claim 24 wherein the step of testing the integrated circuit chips of the first wafer and the integrated circuit chips of the second wafer further comprises testing the integrated circuit chips of the first wafer and the integrated circuit chips of the second wafer for non-conformance.

32. The method as recited in claim 24 wherein the integrated circuit chips of the first wafer and the integrated circuit chips of the second wafer are digital devices.

33. The method as recited in claim 24 wherein the integrated circuit chips of the first wafer and the integrated circuit chips of the second wafer are analog devices.

34. The method as recited in claim 24 wherein the integrated circuit chips of the first wafer and the integrated circuit chips of the second wafer are Ral devices.

35. The method as recited in claim 24 further comprising electrically coupling at least two of the chip assemblies having chips of the first wafer and at least one of the chip assemblies having chips of the second wafer onto the substrate.

36. A matched set assembled by the method as recited in claim 24.

37. A matched set of integrated circuit chips including an integrated circuit chip from a first wafer and an integrated circuit chip for a second wafer, the integrated circuit chips of the first and second wafers being tested together, the matched set comprising:

a first chip assembly diced from a first wafer-interposer assembly having one of the integrated circuit chips from the first wafer;

a second chip assembly diced from a second wafer-interposer assembly having one of the integrated circuit chips from the second wafer; and a substrate electrically coupled to the first and second chip assemblies.

38. The matched set as recited in claim 37 wherein the integrated circuit chips of the first wafer are integrated circuits of a first type and the integrated circuit chips of the second wafer are integrated circuits of a second type.

39. The matched set as recited in claim 37 wherein the integrated circuit chips of the first wafer and the integrated circuit chips of the second wafer are digital devices.

40. The matched set as recited in claim 37 wherein the integrated circuit chips of the first wafer and the integrated circuit chips of the second wafer are analog devices.

41. The matched set as recited in claim 37 wherein the integrated circuit chips of the first wafer and the integrated circuit chips of the second wafer are RF devices.

42. The matched set as recited in claim 37 further comprising a third chip assembly diced from the first wafer-interposer assembly having one of the integrated circuit chips from the first wafer, the third chip assembly electrically coupled to the substrate.

* * * * *

UNITED STATES PATENT AND TRADEMARK OFFICE
CERTIFICATE OF CORRECTION

PATENT NO.    : 6,483,330 B1
DATED         : November 19, 2002
INVENTOR(S)   : Jerry D. Kline It is certified that error appears in the above-identified patent and that said Letters Patent is hereby corrected as shown below:

<u>Column 16,</u>
Line 9, "Ral" should read -- RF --.

Signed and Sealed this

Eleventh Day of February, 2003

JAMES E. ROGAN
*Director of the United States Patent and Trademark Office*